United States Patent [19]

Riemenschneider et al.

[11] Patent Number: 5,057,886

[45] Date of Patent: Oct. 15, 1991

[54] NON-VOLATILE MEMORY WITH IMPROVED COUPLING BETWEEN GATES

[75] Inventors: Bert R. Riemenschneider, Murphy; Howard L. Tigelaar, Allen, both of Tex.

[73] Assignee: Texas Instruments Incorporated, Dallas, Tex.

[21] Appl. No.: 288,542

[22] Filed: Dec. 21, 1988

[51] Int. Cl.$^5$ .................... H01L 29/68; H01L 29/34; G11C 11/34
[52] U.S. Cl. .................... 357/23.5; 357/54; 365/185
[58] Field of Search ............... 357/54, 23.5, 23, 23.5; 365/185, 218, 182

[56] References Cited

U.S. PATENT DOCUMENTS

| 4,297,718 | 10/1981 | Hsu | 357/54 X |
| 4,513,397 | 4/1985 | Ipri et al. | 357/23.5 |
| 4,853,895 | 8/1989 | Mitchell et al. | 357/23.5 X |

FOREIGN PATENT DOCUMENTS 2165991 4/1986 United Kingdom .............. 357/23.5

Primary Examiner—Rolf Hille
Assistant Examiner—Robert P. Limanek
Attorney, Agent, or Firm—Douglas A. Sorensen; James T. Comfort; Melvin Sharp

[57] ABSTRACT

A non-volatile memory is provided which provides a floating gate (42) disposed over control gate (38) in order to increase the coupling therebetween. The degree of coupling may be varied by adjusting the area of the floating gate formed over the control gate relative to the area of the floating gate over the substrate.

34 Claims, 2 Drawing Sheets

NON-VOLATILE MEMORY WITH IMPROVED COUPLING BETWEEN GATES

TECHNICAL FIELD OF THE INVENTION

This invention relates in general to semiconductor devices, and more particularly to a non-volatile memory having improved coupling between gates for more efficient programming.

BACKGROUND OF THE INVENTION

Conventional EPROM devices are structured such that a control gate overlies a plurality of floating gates which are disposed between bitlines formed in a semiconductor surface. To program a standard EPROM memory cell, a voltage of approximately 14 volts is applied to the control gate and a voltage of approximately 10 volts is applied to one of the source/drain regions while the other source/drain is held at ground. The voltage on the control gate results in a depletion region between the two source/drain regions. When one source/drain is pulsed at 10 volts, a flow of electrons between source/drain regions the charge on the control gate, some of the electrons flowing between the source/drain regions will gain sufficient energy to penetrate an oxide layer and drift into the floating gate. This process is often termed "hot-electron channel injection."

The rate at which electrons are attracted to the floating gate will depend upon the coupling between the floating gate and the control gate. A higher degree of coupling will produce a higher voltage on the floating gate, resulting in a greater number of electrons attracted thereto.

In conventional EEPROM devices, a thin tunnel oxide window is positioned in the gate dielectric near the source or drain region. To program the cell, the gate is pulsed to a voltage of approximately 17 volts while the source or drain is held at ground. The high electric field generated across the thin tunnel oxide causes a current to flow due to Fowler-Nordheim tunneling which charges the floating gate with electrons.

In both EPROMs and EEPROMs, higher coupling between the control gate and the floating gate increases the electric field across the gate oxide enhancing programming.

Typically, coupling between the control gate and the floating gate is on the order of 0.65-0.70. By increasing the coupling, the programmability of the device is improved, and therefore, a lower programming voltage may be used.

In order to increase coupling, present-day EPROMs and EEPROMs use a floating gate which extends over a thick oxide to maximize the area between the control gate and the floating gate. However, a fairly strong coupling component exists between the floating gate and the underlying substrate. Thus, a long floating gate also produces a high capacitance between the floating gate and the substrate, thereby negating some of the beneficial effects of a long floating gate. Additionally, extending the floating gate over the field oxide greatly increases the size of the cell.

Therefore, a need has arisen to provide a non-volatile memory with improved coupling within a small area between the floating gate and the control gate to enhance programmability.

SUMMARY OF THE INVENTION

In accordance with the present invention, a method and apparatus for storing information is provided which substantially eliminates or prevents the disadvantages and problems associated with prior non-volatile memories.

In a first aspect of the invention, a non-volatile memory cell is provided having a substrate with source/drain regions formed therein. A control gate is formed over a first portion of the area between the source and drain regions. A floating gate is formed such that it covers both a portion of the control gate and the remaining portion of the area between source and drain. During programming, the effective coupling between the control gate and floating gate is increased relative to present day devices since the presence of the control gate decreases the coupling between the floating gate and the underlying substrate.

This aspect of the present invention provides the technical advantage that the efficiency of the memory cell is increased during programming, thereby allowing the memory cell to operate at a lower programming voltage and to occupy much less area.

In a second aspect of the present invention, a tunnel oxide is provided between the floating gate and the underlying substrate. This structure may be used as either a FLASH EPROM, FLASH EEPROM or an EEPROM. The increased coupling provided by the present invention also enhances the speed at which EEPROM programming and erase may be accomplished.

In a third aspect of the present invention, a polysilicon wordline is disposed over the floating gate and electrically connected to the control gate. This aspect of the invention further increases the coupling to the floating gate.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The preferred embodiment of the present invention is best understood by referring to FIGS. 1–7 of the drawings, like numerals being used for like and corresponding parts of the various drawings.

Figure 1:
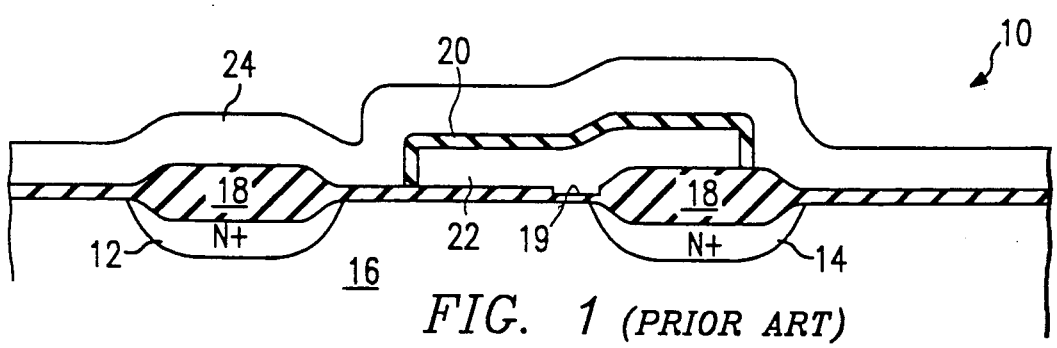
FIG. 1 illustrates a cross-sectional side view of a prior art non-volatile memory cell.

FIG. 1 illustrates a conventional prior art EEPROM memory cell with a merged pass gate transistor. The EPROM memory cell 10 comprises N. source/drain regions 12 and 14 formed in a P- substrate 16. A dielectric oxide layer 18 having a tunnel oxide window 19 is formed above the surface of the substrate 16. A second dielectric layer 20 encloses a floating gate 22. A control gate 24 is formed above the floating gate 22, being separated from the floating gate 22 by the dielectric layer 20.

The floating gate 22 is programmed (written to) by accummulating negative charge on the floating gate 22 through Fowler-Nordheim tunnel injection (for FLASH EPROMs or EEPROMs) or by hot-electron channel injection (for EPROMs). Typically, to charge a floating gate, a voltage of approximately 14 volts is placed on the control gate 24 to form a channel between the source/drain regions 12 and 14 thereunder. Source/drain region 14 is pulsed at approximately 10 volts, while the region 12 is held at ground. This procedure produces a flow of electrons between the source/drain regions 12 and 14, as in an N-channel transistor. Because the high electric field created by the charge on the control gate 24, some of the electrons flowing between the source/drain regions 12 and 14 will gain sufficient energy to penetrate the dielectric layer 18 and drift into the floating gate 22. The number of electrons which drift into the floating gate 22 will be dependent upon the coupling between the control gate 24 and floating gate 22, since a larger voltage on the floating gate 22 will attract more electrons.

The speed at which the memory cell 10 can be programmed is dependent upon the rate at which electrons are attracted to the floating gate 22. Therefore, if more electrons can be drawn to the floating gate 22 in a given time, then the programming speed may be increased. Further, by increasing coupling between the control gate 24 and the floating gate 22, the voltage on the control gate 24 may be reduced.

Figure 2A:
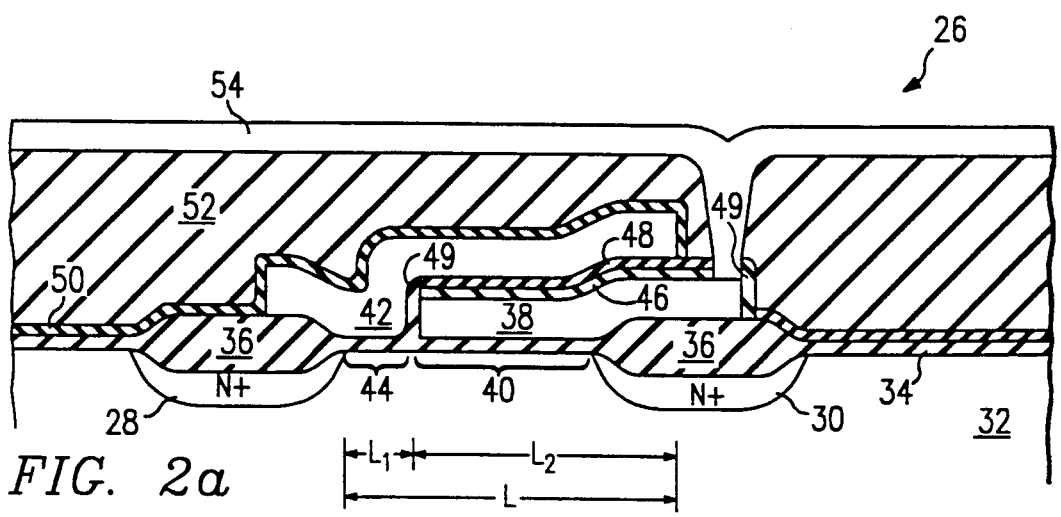
FIGS. 2a-b illustrates a cross-sectional side view and a top plan view of the non-volatile memory cell of the present invention.
Figure 2B:
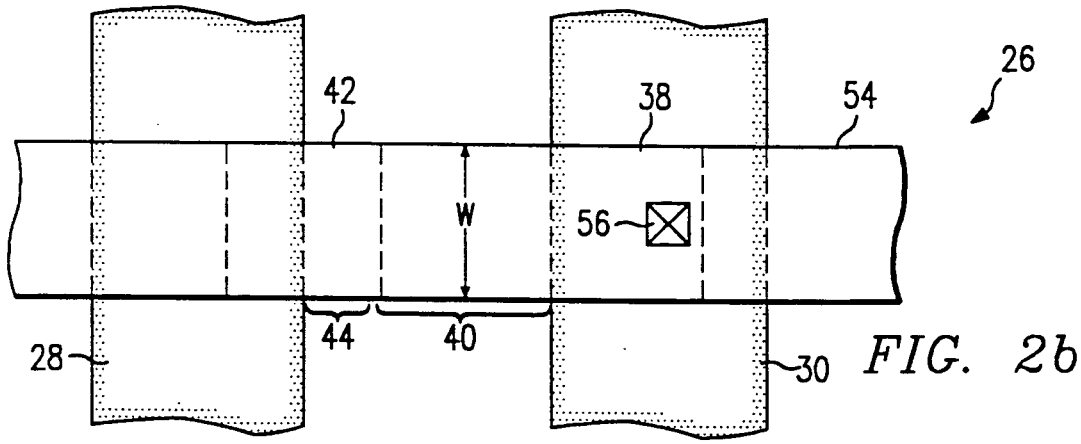

FIGS. 2a–b illustrate a cross-sectional side view of the memory cell 26 of the present invention. The memory cell 26 comprises source/drain regions 28 and 30 disposed in a semiconductor surface 32. The source/drain regions 28 and 30 and the top portion of the semiconductor surface 32 are covered by a dielectric layer 34 having areas of increased thickness 36 over the source/drain regions 28 and 30. A control gate 38 overlies a first portion 40 of the semiconductor surface 32 between the source/drain regions 28 and 30. A floating gate 42 overlies a second portion 44 of the semiconductor surface between the source/drain regions 28 and 30 and also overlies a portion of the control gate 38. The control gate 38 is separated from the floating gate 42 by an interlevel oxide (ILO) layer 46 and an interlevel nitride (ILN) layer 48 and a sidewall oxide regions 49. A sealing oxide layer 50 is disposed over the structure and a relatively planar oxide 52 covers the sealing oxide 50. A metal layer 54 is disposed over the planar oxide 52 and contacts the control gate 38.

FIG. 2b illustrates a top plan view of the memory cell 26 of the present invention. As shown, the floating gate 42 overlaps the control gate 38 over the substrate 32, between bitlines 28 and 30. Contact 56 indicates the region in which the metal layer 54 contacts the control gate 38.

The memory cell 26 of the present invention increases coupling between the control gate 38 and the floating gate 42 by effectively decoupling a large portion of the floating gate 42 from the underlying substrate 32.

The increased coupling between the control gate 38 and floating gate 42 can be shown by mathematical expression:

$$K = C_2/(C_1 + C_2),$$

where $C_1$ = capacitance between the floating gate 42 and the substrate 32

$C_2$ = capacitance between the floating gate 42 and the control gate 38

K = coupling between the control gate 38 and the floating gate 42 neglecting capacitances between the floating gate 42 and the source/drains 28 and 30, which should be small.

Assuming the dielectric constants for the dielectric layer 34 and the ILO/ILN 46 and 48 are equal, as are the electrical thicknesses thereof, then $C_1$ should be proportional to the area between the floating gate and the substrate ($A_1$), and $C_2$ should be proportional to the area between the floating gate and the control gate ($A_2$). Since $A_1 = L_1 w$ and $A_2 = L_2 w$ (where w=width), the equation for coupling simplifies to:

$$K = L_2/(L_1 + L_2) \text{ since } L = L_1 + L_2, L_1 = L - L_2$$

and thus $$K = L_2/L$$

Table I illustrates the coupling per various combinations.

TABLE I

| COUPLING FOR VARIOUS CONFIGURATIONS | | |
|---|---|---|
| L | $L_2$ | K |
| 1.5 | 0.75 | .5 |
| 1.5 | 1.00 | .67 |
| 2.0 | 1.50 | .75 |
| 1.25 | 0.75 | .60 |
| 1.25 | 1.00 | .80 |

The assumptions that the dielectric constants and electrical thicknesses are equal for the dielectrics disposed between the floating gate 42 and control gate 38 and between the floating gate 42 and the semiconductor surface 32 are very conservative. In practice, the dielectric constant for the material between the floating gate 42 and the control gate 38 will be substantially greater than that for the material between the floating gate 42 and semiconductor surface 32. Hence, the capacitance between the floating gate 42 and control gate 38 will be substantially higher, thereby increasing the coupling.

Typical coupling figures for conventional EEPROMs range between 0.65–0.70. As shown in Table I, for a configuration in which the area of the floating gate overlying the control gate is four times that of the area of the floating gate 42 overlying the semiconductor surface 32, a coupling coefficient of 0.80 is achieved, a substantial improvement over the prior art. An overlap of three-to-one results in a coupling coefficient of 0.75, also an improvement over the prior art.

Figure 3:
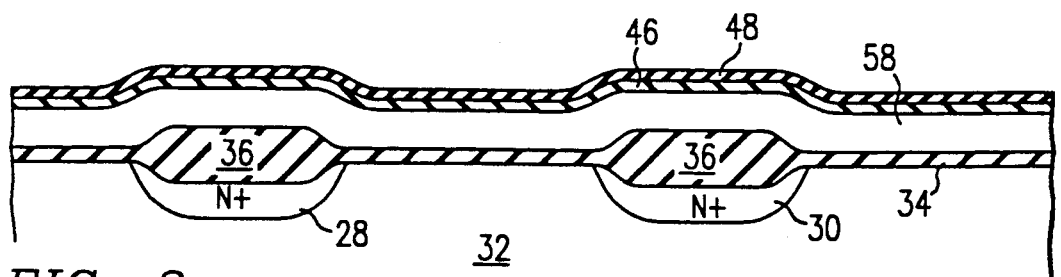
FIG. 3 illustrates a cross-sectional side view of the memory cell of the present invention after a first processing stage.

FIGS. 3–6 illustrate the process flow for fabricating the memory cell of the present invention. FIG. 3 illustrates the memory cell after the first processing stage. The semiconductor surface 32, typically a P- silicon layer, is patterned with photoresist, followed by implantation of an N+ dopant to form the source/drain regions or bitlines 28 and 30. A thermal oxide layer 34 of about 500 Angstroms is grown over the silicon surface 32. The N+ regions 28 and 30 enhance the growth of the oxide layer 34 thereover, creating areas of increased thickness 36. Typically, the areas of increased thickness 36 are about 2500 Angstroms thick. A polysilicon layer 58 is formed over the dielectric layer 34, and ILO and ILN layers 46 and 48 are formed over the polysilicon layer 58.

Figure 4:
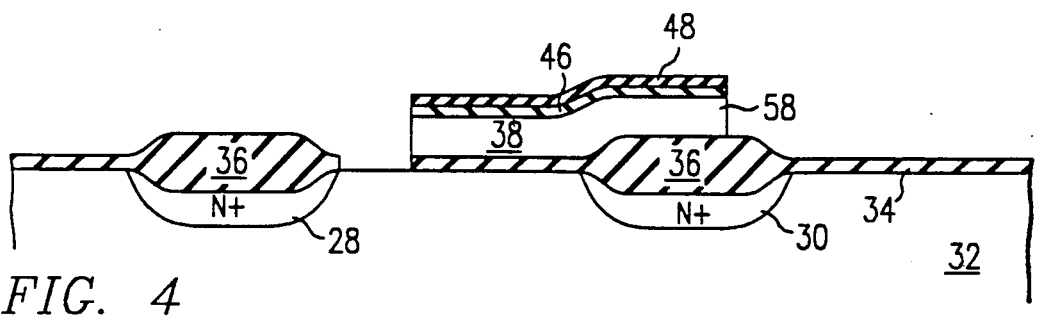
FIG. 4 illustrates a cross-sectional side view of the memory cell of the present invention after a second processing stage.

In FIG. 4, a cross-sectional side view of the memory cell of the present invention is shown after a second processing stage. The polysilicon layer 58 and ILO-/ILN layers 46 and 48 are masked to define the control gate 38 in a first direction. At this point, long strips of the polysilicon layer 58 remain, the control gate 38 being etched in a second direction as described in connection with FIG. 6. At this point, the oxide beneath where the floating gate will be formed is typically stripped.

Figure 5A:
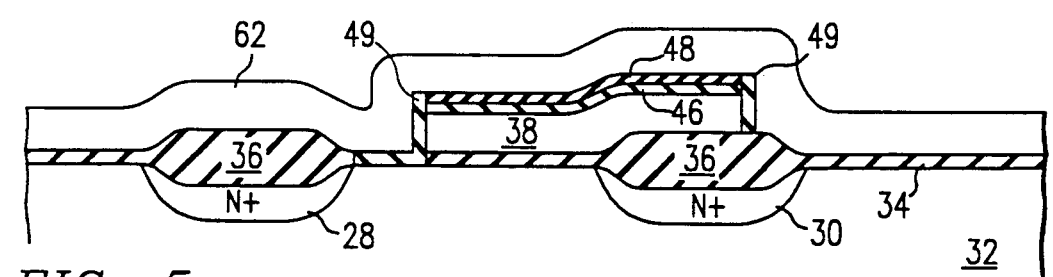
FIG. 5a illustrates a cross-sectional side view of the memory cell of the present invention after a third processing stage.
Figure 5B:
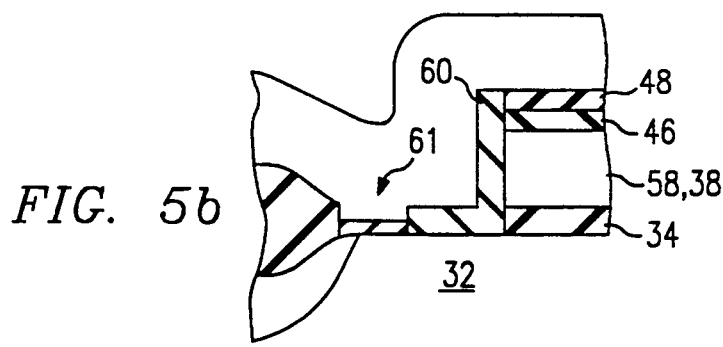
FIG. 5b, illustrates a cross-sectional side view of an optional embodiment of the memory cell of the present invention after a third processing stage.

In FIG. 5a, a cross-sectional side view of the present invention is illustrated after a third processing stage. The previously stripped oxide is regrown to a thickness of about 300 Angstroms simultaneously with sidewall oxide regions 49 formed on the exposed edges of the control gate 38. At this point, a tunnel oxide 61 is formed as illustrated in FIG. 5b. To form the tunnel oxide 61, a portion of the oxide layer is removed down to the substrate 32 and approximately 100 angstroms of oxide is regrown. This results in about 50 Angstroms of additional oxide being added to the 300 Angstrom regrowth.

Referring again to FIG. 5a, a second polysilicon layer 62 is formed over the device.

Figure 6:
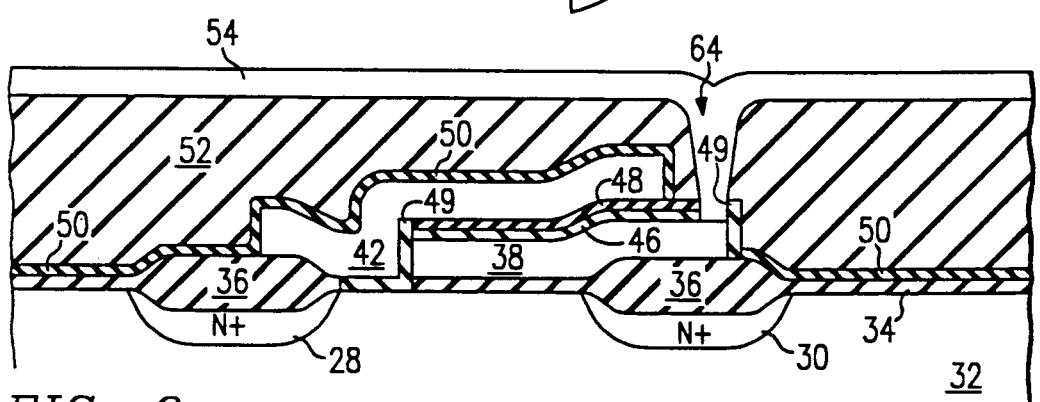
FIG. 6 illustrates a cross-sectional side view of the memory cell of the present invention after a fourth processing stage.

In FIG. 6, the second polysilicon layer 62 is patterned and etched to define the floating gate in a first direction. Thereafter, a stack etch is performed to define the floating gate 42 and control gate 38 in a second direction, such that rectangular gates are created.

The sealing oxide 50 is grown over the device, forming a thin layer over exposed portions of oxide and polysilicon. Thereafter, the thick planar oxide 52 is deposited over the device and planarized. A window 64 is etched through the planar oxide 52, ILN layer 48, and ILO layer 46 to expose a portion of control gate 38. Thereafter, the metal layer 54 is deposited, patterned and etched to provide electrical contact to the control gate 38.

Figure 7:
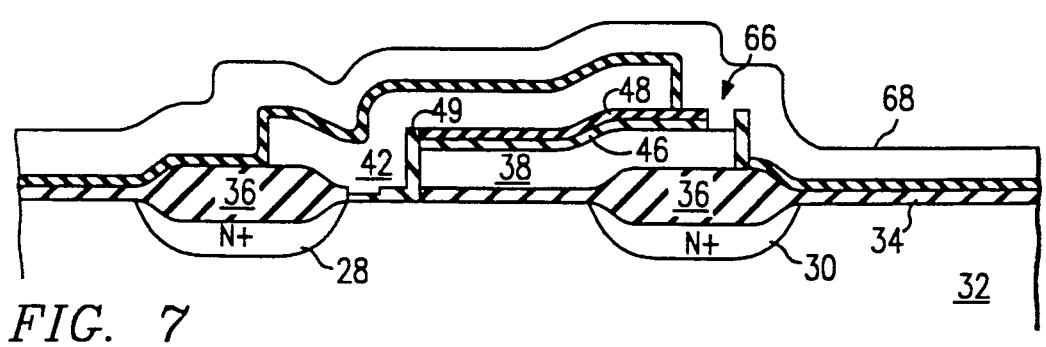
FIG. 7 illustrates a cross-sectional side view of a second embodiment of the present invention using a third polysilicon layer to further improve coupling.

FIG. 7 illustrates a cross-sectional side view of an alternative embodiment of the present invention. The process steps performed in connection with FIGS. 3-5 are repeated. The second polysilicon layer 62 is patterned and etched to define the floating gates in a first direction. A sealing oxide layer 50 is deposited or grown over the device. A contact opening 66 is patterned and etched in through the ILN layer 48 and ILO layer 46 to expose a portion of the control gate 38. A third layer of polysilicon 68 is deposited over the device and a stack 5 etch is performed. The stack etch forms wordlines in the third polysilicon layer 68 and defines the floating gates 42 and control gates 38. The wordlines 68 contact the control gates 38 through the contact opening 66.

This embodiment of the present invention provides additional technical advantages over the prior art. The wordline provides additional capacitive coupling to the floating gate, thereby increasing the rate at which electrons are attracted to the floating gate.

Although the present invention has been described in detail, it should be understood that various changes, substitutions and alterations can be made herein without departing from the spirit and scope of the invention as defined by the appended claims.

What is claimed is:

1. A non-volatile memory cell comprising:
   a semiconductive substrate having a first conductivity type;
   first and second doped regions formed in the surface of said substrate having a second conductivity type, said first and second doped regions being separated by a channel region;
   a first dielectric layer formed on said channel region;
   a first conductive layer formed on said first dielectric layer, said first conductive layer being formed over a first portion of said channel region;
   a second dielectric layer formed on said first conductive layer, said second dielectric having an opening exposing said first conductive layer;
   a second conductive layer formed on the portion of said first dielectric layer not covered by said first conductive layer, and said second conductive layer extending onto said second dielectric layer, but not extending to said opening;
   a third dielectric layer formed on said second conductive layer, said third dielectric layer covering said second conductive layer; and
   a third conductive layer formed on said third dielectric layer, said third conductive layer extending into said opening in said second dielectric layer to make conductive contact with said first conductive layer.

2. A non-volatile memory cell as in claim 1 wherein said first dielectric layer further includes a thinner tunneling dielectric portion between said channel region and said second conductive layer.

3. A non-volatile memory cell as in claim 1 wherein said first and second doped regions serve as bit lines in an array of memory cells including said non-volatile memory cell.

4. A non-volatile memory cell as in claim 1 wherein said first conductive layer comprises polycrystalline silicon.

5. A non-volatile memory cell as in claim 1 wherein said second conductive layer comprises polycrystalline silicon.

6. A non-volatile memory cell as in claim 1 wherein said third conductive layer comprises polycrystalline silicon.

7. A non-volatile memory cell as in claim 1 wherein said third conductive layer comprises a word line of an array of memory cells including said non-volatile memory cell.

8. A non-volatile memory cell as in claim 1 wherein said first dielectric layer comprises silicon dioxide.

9. A non-volatile memory cell as in claim 1 wherein said second dielectric layer comprises silicon dioxide.

10. A non-volatile memory cell as in claim 1 wherein said second dielectric layer comprises silicon nitride.

11. A non-volatile memory cell as in claim 1 wherein said second dielectric layer comprises silicon dioxide and silicon nitride.

12. A non-volatile memory cell as in claim 1 wherein said third dielectric layer comprises silicon dioxide.

13. A non-volatile memory cell as in claim 1 further comprising:
a first field insulating layer formed on the surface of said substrate above said first doped region; and
a second field insulating layer formed on the surface of said substrate above said second doped region;
wherein said first conductive layer extends onto said first field insulating layer.

14. A non-volatile memory cell as in claim 13 wherein said opening in said second dielectric layer is positioned above said first field oxide region.

15. A non-volatile memory cell comprising:
a crystalline silicon substrate having a first conductivity type;
first and second doped regions formed in the surface of said substrate having a second conductivity type, said first and second doped regions being separated by a channel region;
a first field oxide layer formed on the surface of said substrate above said first doped region; and
a second field oxide layer formed on the surface of said substrate above said second doped region;
a first dielectric layer formed on said channel region, said first dielectric layer including silicon dioxide;
a first polycrystalline silicon layer formed on said first dielectric layer, said first polycrystalline silicon layer being formed over a first portion of said channel region;
a second dielectric layer formed on said first polycrystalline silicon layer, said second dielectric layer including silicon dioxide and silicon nitride, said second dielectric layer having an opening exposing said first polycrystalline silicon layer;
a second polycrystalline silicon layer formed on the portion of said first dielectric layer not covered by said first polycrystalline silicon layer, and said second polycrystalline silicon layer extending onto said second dielectric layer, but not extending to said opening;
a third dielectric layer formed on said second conductive layer, said third dielectric layer including silicon dioxide, said third dielectric layer covering said second polycrystalline silicon layer; and
a third polycrystalline silicon layer formed on said third dielectric layer, said third polycrystalline silicon layer extending into said opening in said second dielectric layer to make conductive contact with said first polycrystalline silicon layer.

16. A non-volatile memory cell as in claim 15 wherein said first dielectric layer further includes a thinner tunneling dielectric portion between said channel region and said second polycrystalline silicon layer.

17. A non-volatile memory cell as in claim 15 wherein said first and second doped regions serve as bit lines in an array of memory cells including said non-volatile memory cell.

18. An array of non-volatile memory cells, each cell comprising:
a semiconductive substrate having a first conductivity type;
first and second doped regions formed in the surface of said substrate having a second conductivity type, said first and second doped regions being separated by a channel region;
a first dielectric layer formed on said channel region;
a first conductive layer formed on said first dielectric layer, said first conductive layer being formed over a first portion of said channel region;
a second dielectric layer formed on said first conductive layer, said second dielectric having an opening exposing said first conductive layer;
a second conductive layer formed on the portion of said first dielectric layer not covered by said first conductive layer, and said second conductive layer extending onto said second dielectric layer, but not extending to said opening;
a third dielectric layer formed on said second conductive layer, said third dielectric layer covering said second conductive layer; and
a third conductive layer formed on said third dielectric layer, said third conductive layer extending into said opening in said second dielectric layer to make conductive contact with said first conductive layer.

19. A non-volatile memory cell as in claim 18 wherein said first dielectric layer further includes a thinner tunneling dielectric portion between said channel region and said second conductive layer.

20. An array of non-volatile memory cells as in claim 18 wherein said first and second doped regions serve as bit lines in said array of memory cells.

21. An array of non-volatile memory cells as in claim 18 wherein said first conductive layer comprises polycrystalline silicon.

22. An array of non-volatile memory cells as in claim 18 wherein said second conductive layer comprises polycrystalline silicon.

23. An array of non-volatile memory cells as in claim 18 wherein said third conductive layer comprises polycrystalline silicon.

24. An array of non-volatile memory cells as in claim 18 wherein said third conductive layer comprises a word line of said array of memory cells.

25. An array of non-volatile memory cells as in claim 18 wherein said first dielectric layer comprises silicon dioxide.

26. An array of non-volatile memory cells as in claim 18 wherein said second dielectric layer comprises silicon dioxide.

27. An array of non-volatile memory cells as in claim 18 wherein said second dielectric layer comprises silicon nitride.

28. An array of non-volatile memory cells as in claim 18 wherein said second dielectric layer comprises silicon dioxide and silicon nitride.

29. An array of non-volatile memory cells as in claim 18 wherein said third dielectric layer comprises silicon dioxide.

30. An array of non-volatile memory cells as in claim 18 further comprising:
a first field insulating layer formed on the surface of said substrate above said first doped region; and
a second field insulating layer formed on the surface of said substrate above said second doped region;
wherein said first conductive layer extends onto said first field insulating layer.

31. An array of non-volatile memory cells as in claim 30 wherein said opening in said second dielectric layer is positioned above said first field oxide region.

32. An array of non-volatile memory cells, each cell comprising:
a polycrystalline silicon substrate having a first conductivity type;
first and second doped regions formed in the surface of said substrate having a second conductivity type, said first and second doped regions being separated by a channel region;

a first field oxide layer formed on the surface of said substrate above said first doped region; and a second field oxide layer formed on the surface of said substrate above said second doped region;

a first dielectric layer formed on said channel region, said first dielectric layer including silicon dioxide;

a first polycrystalline silicon layer formed on said first dielectric layer, and first polycrystalline silicone layer being formed over a first portion of said channel region;

a second dielectric layer formed on said first polycrystalline silicon layer, said second dielectric layer including silicon dioxide and silicon nitride, said second dielectric layer having an opening exposing said first polycrystalline silicon layer;

a second polycrystalline silicon layer formed on the portion of said first dielectric layer not covered by said first polycrystalline silicon layer, and said second polycrystalline silicon layer extending onto said second dielectric layer, but not extending to said opening;

a third dielectric layer formed on said second conductive layer, said third dielectric layer including silicon dioxide, said third dielectric layer covering said second polycrystalline silicon layer; and a third polycrystalline silicon layer formed on said third dielectric layer, said third polycrystalline silicon layer extending into said opening in said second dielectric layer to make conductive contact with said first polycrystalline silicon layer.

33. A non-volatile memory cell as in claim 32 wherein said first dielectric layer further includes a thinner tunneling dielectric portion between said channel region and said second polycrystalline silicon layer.

34. An array of non-volatile memory cells as in claim 32 wherein said first and second doped regions serve as bit lines in an array of memory cells including said non-volatile memory cell.

* * * * *